United States Patent
Kato

(10) Patent No.: US 12,381,142 B2
(45) Date of Patent: Aug. 5, 2025

(54) SEMICONDUCTOR DEVICE WITH CONDUCTORS DISPOSED IN INSULATING FILMS AND METHOD FOR MANUFACTURING THE SAME

(71) Applicant: Kioxia Corporation, Tokyo (JP)

(72) Inventor: Atsushi Kato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 333 days.

(21) Appl. No.: 17/887,926

(22) Filed: Aug. 15, 2022

(65) Prior Publication Data

US 2023/0187344 A1 Jun. 15, 2023

(30) Foreign Application Priority Data

Dec. 15, 2021 (JP) .................. 2021-203767

(51) Int. Cl.
| | |
|---|---|
| *H01L 23/522* | (2006.01) |
| *H01L 21/02* | (2006.01) |
| *H01L 21/768* | (2006.01) |
| *H01L 23/532* | (2006.01) |

(52) U.S. Cl.
CPC ...... *H01L 23/5226* (2013.01); *H01L 21/0226* (2013.01); *H01L 21/768* (2013.01); *H01L 23/53209* (2013.01); *H01L 23/53295* (2013.01)

(58) Field of Classification Search
CPC ............ H01L 23/5226; H01L 21/0226; H01L 21/768
USPC ........................................... 257/774
See application file for complete search history.

(56) References Cited

U.S. PATENT DOCUMENTS

| | | | |
|---|---|---|---|
| 7,514,354 B2 | 4/2009 | Park et al. | |
| 10,685,875 B2 | 6/2020 | Hatano | |
| 2003/0042610 A1* | 3/2003 | Kitada | ............ H01L 23/53257 |
| | | | 257/E21.582 |
| 2008/0012133 A1 | 1/2008 | Shih et al. | |
| 2008/0099921 A1 | 5/2008 | Katata | |
| 2010/0164074 A1* | 7/2010 | King | ............ H01L 21/76826 |
| | | | 257/773 |
| 2010/0314765 A1 | 12/2010 | Liang et al. | |
| 2016/0307793 A1 | 10/2016 | Huang et al. | |
| 2020/0006230 A1* | 1/2020 | Tsai | ............ H01L 23/535 |
| 2021/0151372 A1 | 5/2021 | Okuda et al. | |

(Continued)

FOREIGN PATENT DOCUMENTS

| | | |
|---|---|---|
| EP | 1 289 008 A2 | 3/2003 |
| JP | 2008-117853 A | 5/2008 |
| JP | 2019-140178 A | 8/2019 |

(Continued)

*Primary Examiner* — Quoc D Hoang
(74) *Attorney, Agent, or Firm* — Foley & Lardner LLP

(57) ABSTRACT

A semiconductor device includes: a first insulating film; an interconnect disposed in the first insulating film and containing copper, cobalt, nickel, or manganese; a second insulating film that includes a first portion connected to the interconnect and that contains silicon and nitrogen; a third insulating film including a second portion connected to the first portion; a first conductor disposed in the first portion and in contact with the interconnect; a film covering a side surface of the second portion and containing a metal or containing silicon and nitrogen; and a second conductor disposed in the second portion and in contact with the film.

5 Claims, 11 Drawing Sheets

(56) References Cited

U.S. PATENT DOCUMENTS

2021/0265265 A1    8/2021  Kato
2022/0415710 A1  12/2022  Reid

FOREIGN PATENT DOCUMENTS

| JP | 2021-082703 A | 5/2021 |
| JP | 2021-136269 A | 9/2021 |
| TW | I286376 B | 9/2007 |
| TW | 202006917 A | 2/2020 |
| WO | WO-2021/101909 A1 | 5/2021 |

* cited by examiner

SEMICONDUCTOR DEVICE WITH CONDUCTORS DISPOSED IN INSULATING FILMS AND METHOD FOR MANUFACTURING THE SAME

CROSS-REFERENCE TO RELATED APPLICATION(S)

This application is based upon and claims the benefit of priority from Japanese Patent Application No. 2021-203767, filed Dec. 15, 2021, the entire contents of which are incorporated herein by reference.

FIELD

Embodiments described herein relate generally to a semiconductor device and a method for manufacturing the same.

BACKGROUND

With miniaturization of a semiconductor device, technology development for miniaturization and densification of an interconnect and a via plug has been promoted. In such a semiconductor device, an object improves reliability of the interconnect and the via plug having a high aspect ratio due to the miniaturization. As a method for reducing an aspect ratio of the interconnect and the via plug, a conductor is selectively grown from a lower layer interconnect by atomic layer deposition (ALD) or the like, and a part of a via is embedded therein.

DETAILED DESCRIPTION

Figure 1A:
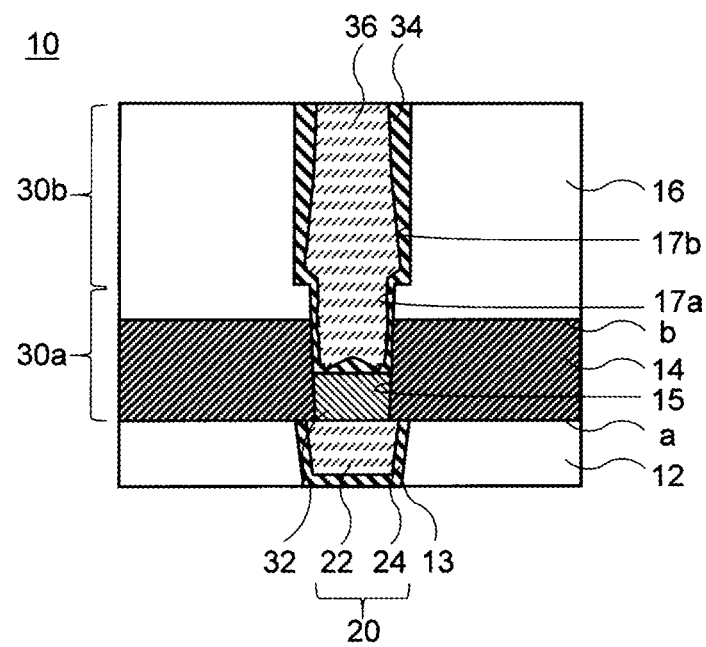
FIG. 1A is a cross-sectional view illustrating a semiconductor device according to at least one embodiment of the present disclosure.

At least one embodiment provides a semiconductor device having an improved reliability.

In general, according to at least one embodiment, a semiconductor device includes: a first insulating film; an interconnect disposed in the first insulating film and containing copper, cobalt, nickel, or manganese; a second insulating film that includes a first portion connected to the interconnect and that contains silicon and nitrogen; a third insulating film including a second portion connected to the first portion; a first conductor disposed in the first portion and in contact with the interconnect; a film covering a side surface of the second portion and containing a metal or containing silicon and nitrogen; and a second conductor disposed in the second portion and in contact with the film.

Hereinafter, a semiconductor device and a method for manufacturing the same according to at least one embodiment will be described in detail with reference to the drawings. In the following description, elements having substantially the same functions and configurations are denoted by the same reference numerals or reference numerals to which alphabets are added after the same reference numerals, and the description will be repeated only when necessary. Each of the embodiments described below exemplifies a device and a method for embodying the technical idea of this embodiment. Various modifications may be made to the embodiments without departing from the scope of the disclosure. Such embodiments and modifications thereof would fall within the scope of claims and equivalents thereof.

In order to make the description clearer, a width, a thickness, a shape, and the like of each part may be schematically illustrated in the drawings as compared with an actual aspect, but these are merely examples and do not limit the interpretation of the present disclosure. In the specification and the drawings, elements having the same functions as those described with reference to preceding drawings are denoted by the same reference numerals, and a repetitive description thereof may be omitted.

In the present specification, an expression that "a includes A, B, or C" does not exclude a case in which a includes a plurality of combinations of A to C unless otherwise specified. Furthermore, these expressions do not exclude a case in which a includes other elements.

The following embodiments may be combined with one another as long as no technical contradiction occurs.

First Embodiment

Configuration of Interconnect Structure

A configuration of an interconnect structure of a semiconductor device according to at least one embodiment will be described with reference to FIG. 1A.

FIG. 1A is a cross-sectional view illustrating an interconnect structure 10 of the semiconductor device according to the present embodiment.

As shown in FIG. 1A, the interconnect structure 10 includes a first insulating film 12, a second insulating film 14, a third insulating film 16, a lower layer interconnect 20 disposed in the first insulating film 12, an upper layer interconnect 30b disposed in the third insulating film 16, and a plug 30a connecting the lower layer interconnect 20 and the upper layer interconnect 30b. The first insulating film 12, the second insulating film 14, and the third insulating film 16 are stacked in this order on a substrate (not shown). The first insulating film 12 and the second insulating film 14 include a surface a on which the first insulating film 12 and the second insulating film 14 are in contact with each other, and the second insulating film 14 and the third insulating film 16 include a surface b on which the second insulating film 14 and the third insulating film 16 are in contact with each other.

The first insulating film 12 has a recess 13 having an opening in the surface a. The lower layer interconnect 20 is disposed in the recess 13. The lower layer interconnect 20 includes a third conductor 22 and a second barrier film 24. The second barrier film 24 is in contact with the first insulating film 12 in the recess 13. The third conductor 22 is in contact with the second barrier film 24 in the recess 13. The second barrier film 24 and the third conductor 22 are exposed on the surface a. The second barrier film 24 is in contact with the second insulating film 14 at the surface a. The third conductor 22 may be in contact with the second insulating film 14 at the surface a. The third conductor 22 other than the surface a is covered with the second barrier film 24. That is, the second barrier film 24 is preferably disposed on an inner side surface and a bottom surface of the recess 13, and the third conductor 22 is preferably not in contact with the first insulating film 12.

The second insulating film 14 has a first through via hole 15 penetrating from the surface a to a surface b. The first through via hole 15 is connected to the recess 13. A part of the plug 30a is disposed in the first through via hole 15. The plug 30a disposed in the first through via hole 15 includes a first conductor 32, a first barrier film 34, and a second conductor 36. The first conductor 32 is disposed at a bottom portion of the first through via hole 15. The first conductor 32 is in contact with the second insulating film 14 in the first through via hole 15. The first conductor 32 is exposed on the surface a. The first conductor 32 is in contact with the third conductor 22 at the surface a. The first conductor 32 is formed thinner than the second insulating film 14. Hereinafter, the term "thin" may be rephrased as having a small thickness in a stacking direction of an insulating film, for example. Therefore, the first conductor 32 is not exposed on the surface b. An upper surface of the first conductor 32 is located between the surface a and the surface b. The first barrier film 34 and the second conductor 36 are disposed on the first conductor 32 in the first through via hole 15. The first barrier film 34 is in contact with the first conductor 32 and the second insulating film 14 in the first through via hole 15. The second conductor 36 is in contact with the first barrier film 34 in the first through via hole 15.

The third insulating film 16 has a second through via hole 17a and a recess 17b. The second through via hole 17a is connected to the first through via hole 15. The recess 17b is connected to the second through via hole 17a. A part of the plug 30a is disposed in the second through via hole 17a. The plug 30a disposed in the second through via hole 17a includes the first barrier film 34 and the second conductor 36. The upper layer interconnect 30b is disposed in the recess 17b. The upper layer interconnect 30b includes the first barrier film 34 and the second conductor 36. The first barrier film 34 and the second conductor 36 are disposed in the second through via hole 17a and the recess 17b. The first barrier film 34 is in contact with the third insulating film 16 in the second through via hole 17a and the recess 17b. The second conductor 36 is in contact with the first barrier film 34 in the second through via hole 17a and the recess 17b. The first barrier film 34 and the second conductor 36 disposed in the first through via hole 15, the second through via hole 17a, and the recess 17b are continuous. The second conductor 36 other than an upper surface thereof is covered with the first barrier film 34. That is, the first barrier film 34 is preferably disposed on inner side surfaces of the first through via hole 15, the second through via hole 17a, and the recess 17b and a surface in contact with the first conductor 32, and the second conductor 36 is preferably not in contact with the second insulating film 14 and the third insulating film 16.

A total aspect ratio of the continuous first through via hole 15 and second through via hole 17a may be two or more. A thickness (height from the surface a) of the first conductor 32 may be 10 nm or more, and a thickness of the second insulating film 14 from the surface a to the surface b may be 30 nm or more.

The first insulating film 12 and the third insulating film 16 may contain silicon and oxygen, and may be, for example, a silicon oxide film. The second insulating film 14 may contain silicon and nitrogen, and may be, for example, a silicon nitride film or a silicon carbonitride film. The second conductor 36 may contain copper, cobalt, nickel, manganese, ruthenium, molybdenum, copper-manganese (CuMn), or copper-aluminum (CuAl), and the third conductor 22 may contain copper, cobalt, nickel, manganese, copper-manganese (CuMn), or copper-aluminum (CuAl). The first barrier film 34 and the second barrier film 24 may contain titanium, titanium nitride, tantalum, or tantalum nitride. The first conductor 32 may contain tungsten, molybdenum, ruthenium, cobalt, or nickel.

In the interconnect structure 10 according to at least one embodiment, even if the total aspect ratio of the first through via hole 15 and the second through via hole 17a is a high aspect ratio of, for example, 2 or more, the first conductor 32 is disposed on the lower layer interconnect 20, which moderates (reduces) the aspect ratio. With such a configuration, it is possible to prevent generation of voids in the second conductor 36 due to insufficient coverage of the first barrier film 34, blocking of a frontage of the second conductor 36, or the like. In the interconnect structure 10 according to at least one embodiment, since the first conductor 32 is thinner than the second insulating film 14, the first conductor 32 and the third conductor 22 are surrounded by the first barrier film 34, the second barrier film 24, and the second insulating film 14. With such a configuration, a component (for example, copper) contained in the third conductor 22 can be prevented from diffusing into the first conductor 32 and diffusing into the first insulating film 12 or the third insulating film 16. Accordingly, interconnect reliability of the semiconductor device according to the present embodiment can be improved.

Method for Manufacturing Interconnect Structure

Figure 1B:
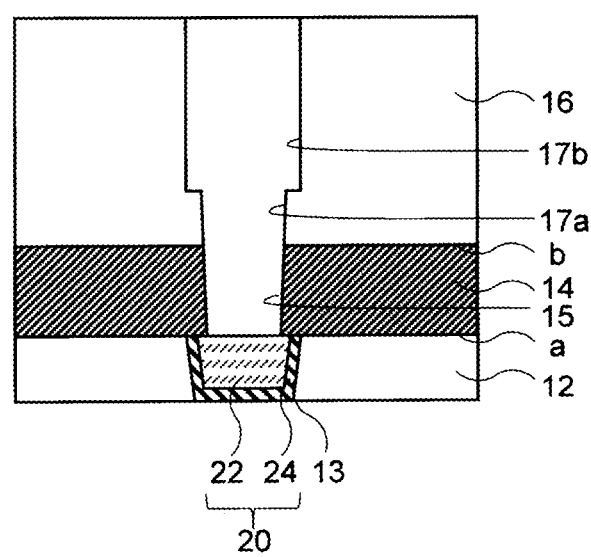
FIG. 1B is a cross-sectional view illustrating a method for manufacturing the semiconductor device according to at least one embodiment of the present disclosure.
Figure 1C:
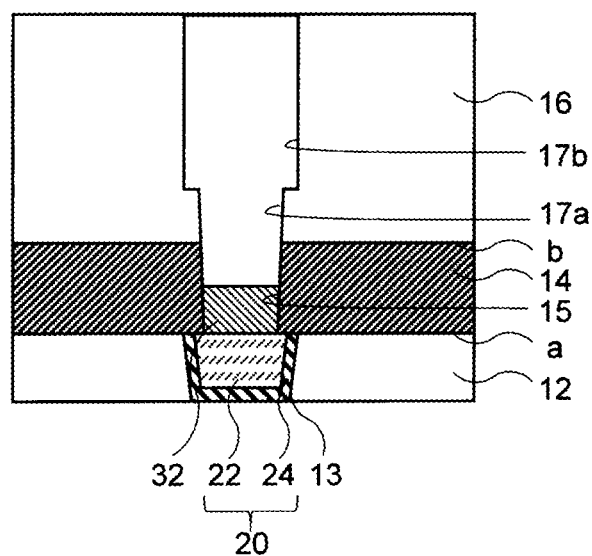
FIG. 1C is a cross-sectional view illustrating the method for manufacturing the semiconductor device according to at least one embodiment of the present disclosure.
Figure 1D:
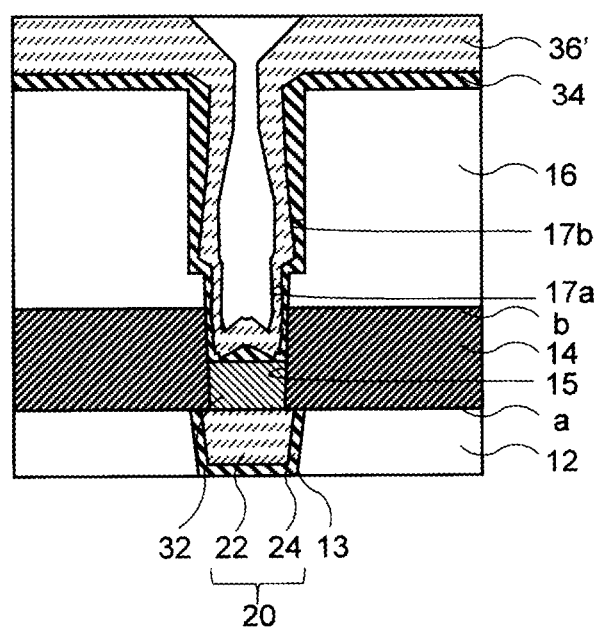
FIG. 1D is a cross-sectional view illustrating the method for manufacturing the semiconductor device according to at least one embodiment of the present disclosure.

FIGS. 1B to 1D are cross-sectional views illustrating a method for manufacturing the interconnect structure of the semiconductor device according to the present embodiment.

As shown in FIG. 1B, the lower layer interconnect 20 is formed in the first insulating film 12. First, the recess 13 is formed in an upper surface of the first insulating film 12. A resist pattern is formed on the first insulating film 12 by a photolithography method in a manner of exposing a region in which the recess 13 is to be formed. The first insulating film 12 exposed from the resist pattern is etched to form the recess 13. The first insulating film 12 may contain silicon and oxygen, and may be, for example, a silicon oxide film.

Next, the third conductor 22 is formed in the recess 13 via the second barrier film 24 to form the lower layer interconnect 20. The second barrier film 24 is formed by, for example, sputtering. The third conductor 22 is formed by, for example, an electrolytic plating method. The third conductor 22 may be formed by, for example, an electrolytic plating method via a seed layer after the seed layer is formed on the second barrier film 24 by sputtering. The third conductor 22 may contain copper, cobalt, nickel, manganese, copper-manganese (CuMn), or copper-aluminum (CuAl), and the second barrier film 24 may contain titanium, titanium nitride, tantalum, or tantalum nitride. By covering the third conductor 22 with the second barrier film 24, the component contained in the third conductor 22 can be prevented from diffusing into the first insulating film 12.

The second insulating film 14 and the third insulating film 16 are sequentially formed on the first insulating film 12 including the lower layer interconnect 20. The second insulating film 14 and the third insulating film 16 are deposited using, for example, a CVD apparatus. A film thickness of the second insulating film 14 is preferably, for example, 30 nm or more. The first insulating film 12 and the second insulating film 14 include the surface a on which the first insulating film 12 and the second insulating film 14 are in contact with each other, and the second insulating film 14 and the third insulating film 16 include the surface b on which the second insulating film 14 and the third insulating film 16 are in contact with each other. As shown in FIG. 1B, in the second insulating film 14 and the third insulating film 16, the recess 17b in which the upper layer interconnect 30b is disposed and the first through via hole 15 and the second through via hole 17a that reach the lower layer interconnect 20 from the recess 17b are formed. The recess 17b, the first through via hole 15, and the second through via hole 17a are formed by etching after forming, on a hard mask made of a metal or the like patterned into a shape of the recess 17b by a photolithography method, a resist pattern patterned to form the first through via hole 15 and the second through via hole 17a. The total aspect ratio of the first through via hole 15 and the second through via hole 17a may be two or more. By forming the first through via hole 15 and the second through via hole 17a on the recess 17b, an upper surface of the third conductor 22 of the lower layer interconnect 20 is exposed at the bottom portion of the first through via hole 15. The second insulating film 14 may contain silicon and nitrogen, and may be, for example, a silicon nitride film or a silicon carbonitride film. The third insulating film 16 may contain silicon and oxygen, and may be, for example, a silicon oxide film. By partially covering the third conductor 22 with the second insulating film 14, the component contained in the third conductor 22 can be prevented from diffusing into the third insulating film 16.

As shown in FIG. 1C, the first conductor 32 is formed on the third conductor 22 at the bottom portion of the first through via hole 15. The first conductor 32 is selectively grown using, for example, an ALD method. A film thickness of the first conductor 32 is smaller than the film thickness of the second insulating film 14. The film thickness of the first conductor 32 is preferably, for example, 10 nm or more. By forming the first conductor 32 on the third conductor 22, the aspect ratio of the first through via hole 15 and the second through via hole 17a can be moderated (reduced). The first conductor 32 may contain tungsten, molybdenum, ruthenium, cobalt, or nickel. By forming the first conductor 32 on the third conductor 22, the component contained in the third conductor 22 may diffuse into the first conductor 32.

As shown in FIG. 1D, the second conductor 36 is formed on the first conductor 32 in the first through via hole 15 and in the second through via hole 17a and the recess 17b via the first barrier film 34. The first barrier film 34 is formed by, for example, sputtering. The second conductor 36 is formed by, for example, an electrolytic plating method. The second conductor 36 may be formed by, for example, an electrolytic plating method via a seed layer 36' after the seed layer 36' is formed on the first barrier film 34 by sputtering. The second conductor 36 may contain copper, cobalt, nickel, manganese, ruthenium, molybdenum, copper-manganese (CuMn), or copper-aluminum (CuAl), and the first barrier film 34 may contain titanium, titanium nitride, tantalum, or tantalum nitride. By covering the first conductor 32 with the second insulating film 14 and the first barrier film 34, the component that is contained in the third conductor 22 diffusing into the first conductor 32 can be prevented from diffusing into the third insulating film 16.

Thereafter, annealing is performed, and excess portions of the second conductor 36 and the first barrier film 34 up to an upper surface of the third insulating film 16 are removed by chemical mechanical polishing, whereby the interconnect structure 10 shown in FIG. 1A can be manufactured. Although not shown in the drawing, for example, a silicon nitride film containing silicon and nitrogen may be formed by CVD as an interconnect upper layer insulating film on the interconnect structure 10.

Second Embodiment

Configuration of Interconnect Structure

Figure 2A:
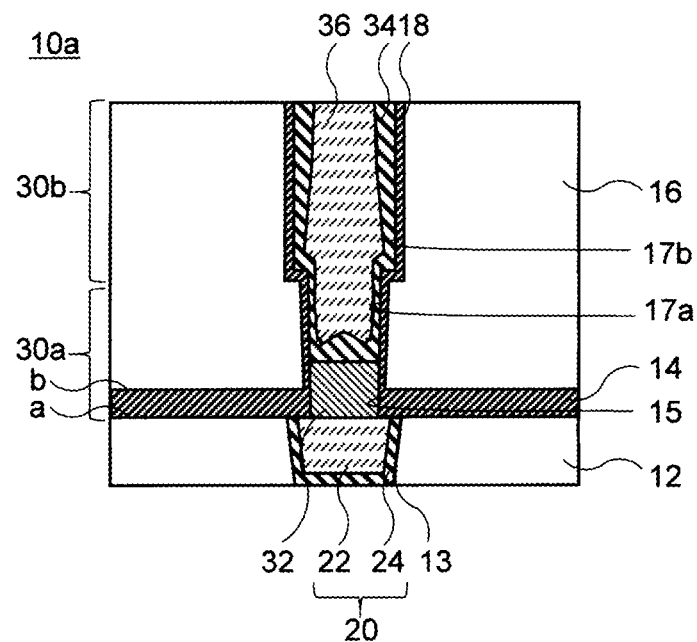
FIG. 2A is a cross-sectional view illustrating a semiconductor device according to at least one embodiment of the present disclosure.

A configuration of an interconnect structure of a semiconductor device according to the present embodiment will be described with reference to FIG. 2A. FIG. 2A is a cross-sectional view illustrating an interconnect structure 10a of the semiconductor device according to at least one present embodiment. The configuration of the interconnect structure according to the present embodiment is the same as the configuration of the interconnect structure according to the first embodiment except that a third barrier film 18 is provided. A description that is the same as the first embodiment will be omitted, and a portion different from the configuration of the interconnect structure according to the first embodiment will be described here.

As shown in FIG. 2A, the interconnect structure 10a includes the first insulating film 12, the second insulating film 14, the third insulating film 16, the lower layer interconnect 20 disposed in the first insulating film 12, the upper layer interconnect 30b disposed in the third insulating film 16, and the plug 30a connecting the lower layer interconnect 20 and the upper layer interconnect 30b.

The first insulating film 12 has the recess 13 having an opening in the surface a. The lower layer interconnect 20 is disposed in the recess 13. The lower layer interconnect 20 includes the third conductor 22 and the second barrier film 24.

The second insulating film 14 has the first through via hole 15 penetrating from the surface a to the surface b. The first through via hole 15 is connected to the recess 13. A part of the plug 30a is disposed in the first through via hole 15. The plug 30a disposed in the first through via hole 15 includes the third barrier film 18 and the first conductor 32. The third barrier film 18 and the first conductor 32 are disposed in the first through via hole 15. The third barrier film 18 is in contact with the second insulating film 14 in the first through via hole 15. The first conductor 32 is in contact with the third barrier film 18 in the first through via hole 15. The third barrier film 18 and the first conductor 32 are exposed on the surface a. The third barrier film 18 and the first conductor 32 are in contact with the third conductor 22 on the surface a. The first conductor 32 is formed thicker than the second insulating film 14. An upper surface of the first conductor 32 is located above the surface b. However, the present disclosure is not limited thereto, and the upper surface of the first conductor 32 may be located between the surface a and the surface b. The first conductor 32 is covered with the third barrier film 18. That is, the third barrier film 18 is disposed on an inner side surface of the first through via hole 15, and the first conductor 32 is not in contact with the second insulating film 14.

The third insulating film 16 has the second through via hole 17a and the recess 17b. The second through via hole 17a is connected to the first through via hole 15. The recess 17b is connected to the second through via hole 17a. A part of the plug 30a is disposed in the second through via hole 17a. The plug 30a disposed in the second through via hole 17a includes the third barrier film 18, the first conductor 32, the first barrier film 34, and the second conductor 36. The upper layer interconnect 30b is disposed in the recess 17b. The upper layer interconnect 30b includes the third barrier film 18, the first barrier film 34, and the second conductor 36. The third barrier film 18, the first conductor 32, the first barrier film 34, and the second conductor 36 are disposed in the second through via hole 17a and the recess 17b. The third barrier film 18 is in contact with the third insulating film 16 in the second through via hole 17a and the recess 17b. The first conductor 32 is in contact with the third barrier film 18 in the second through via hole 17a. The third barrier film 18 and the first conductor 32 that are disposed in the first through via hole 15 and the second through via hole 17a are continuous. The first barrier film 34 and the second conductor 36 are disposed on the first conductor 32 in the second through via hole 17a and in the recess 17b. The first barrier film 34 is in contact with the first conductor 32 and the third barrier film 18 in the second through via hole 17a and the recess 17b. The second conductor 36 is in contact with the first barrier film 34 in the second through via hole 17a and the recess 17b. The first barrier film 34 and the second conductor 36 are covered with the third barrier film 18. That is, the third barrier film 18 is disposed on inner side surfaces of the second through via hole 17a and the recess 17b, and the first barrier film 34 is not in contact with the third insulating film 16. The second conductor 36 other than an upper surface thereof is covered with the first barrier film 34. That is, the first barrier film 34 is disposed at the inner side surfaces of the second through via hole 17a and the recess 17b and on a surface in contact with the first conductor 32, and the second conductor 36 is not in contact with the third barrier film 18.

A total aspect ratio of the continuous first through via hole 15 and second through via hole 17a may be two or more. A thickness (height from the surface a) of the first conductor 32 is not particularly limited, and may be 10 nm or more, or may be 100 nm. The third barrier film 18 may contain silicon and nitrogen, and may be, for example, a silicon nitride film or a silicon carbonitride film. A film thickness of the third barrier film 18 may be, for example, 5 nm.

In the interconnect structure 10a according to the present embodiment, even if the total aspect ratio of the first through via hole 15 and the second through via hole 17a is a high aspect ratio of, for example, 2 or more, the first conductor 32 is disposed on the lower layer interconnect 20, which moderates (reduces) the aspect ratio. With such a configuration, it is possible to prevent generation of voids in the second conductor 36 due to insufficient coverage of the first barrier film 34, blocking of a frontage of the second conductor 36, or the like. Since the interconnect structure 10a according to the present embodiment includes the third barrier film 18, the first conductor 32 and the third conductor 22 are surrounded by the first barrier film 34, the second barrier film 24, and the third barrier film 18. With such a configuration, a component (for example, copper) contained in the third conductor 22 can be prevented from diffusing into the first conductor 32 and diffusing into the first insulating film 12 or the third insulating film 16. Accordingly, interconnect reliability of the semiconductor device according to the present embodiment can be improved.

Method for Manufacturing Interconnect Structure

FIGS. 2B to 2F are cross-sectional views illustrating a method for manufacturing the interconnect structure of the semiconductor device according to the present embodiment. The method for manufacturing the interconnect structure according to the present embodiment is the same as the method for manufacturing the interconnect structure according to the first embodiment except that the third barrier film 18 is formed. A description that is the same as the first embodiment will be omitted, and a portion different from the configuration of the interconnect structure according to the first embodiment will be described here.

Figure 2B:
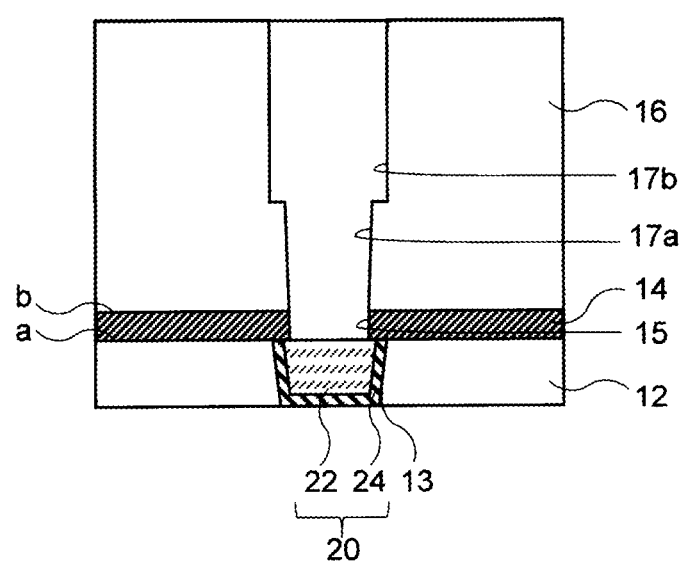
FIG. 2B is a cross-sectional view illustrating a method for manufacturing the semiconductor device according to at least one embodiment of the present disclosure.

As shown in FIG. 2B, the lower layer interconnect 20 is formed in the first insulating film 12. First, the recess 13 is formed in an upper surface of the first insulating film 12. Next, the third conductor 22 is formed in the recess 13 via the second barrier film 24 to form the lower layer interconnect 20. By covering the third conductor 22 with the second barrier film 24, the component contained in the third conductor 22 can be prevented from diffusing into the first insulating film 12.

The second insulating film 14 and the third insulating film 16 are sequentially formed on the first insulating film 12 including the lower layer interconnect 20. A film thickness of the second insulating film 14 is not particularly limited. As shown in FIG. 2B, in the second insulating film 14 and the third insulating film 16, the recess 17b in which the upper layer interconnect 30b is disposed and the first through via hole 15 and the second through via hole 17a that reach the lower layer interconnect 20 from the recess 17b are formed. The total aspect ratio of the first through via hole 15 and the second through via hole 17a may be two or more. By forming the first through via hole 15 and the second through via hole 17a on the recess 17b, an upper surface of the third conductor 22 of the lower layer interconnect 20 is exposed at the bottom portion of the first through via hole 15. By partially covering the third conductor 22 with the second insulating film 14, the component contained in the third conductor 22 can be prevented from diffusing into the third insulating film 16.

Figure 2C:
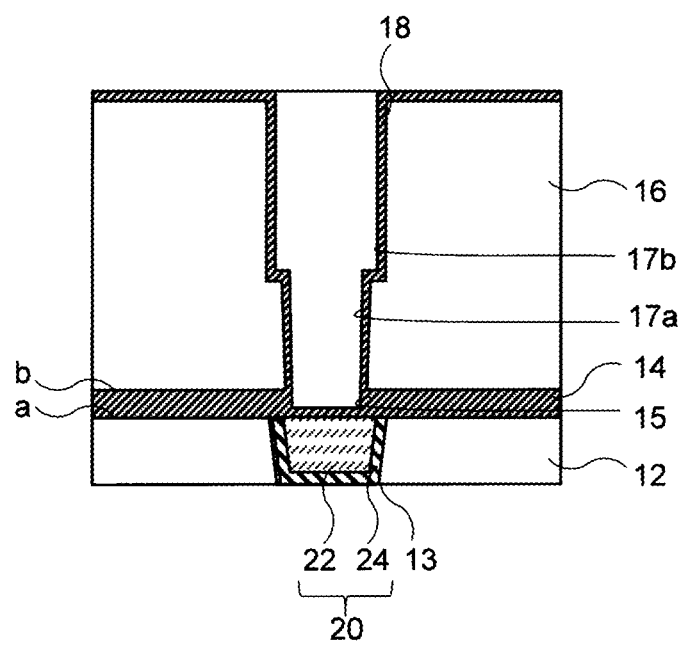
FIG. 2C is a cross-sectional view illustrating the method for manufacturing the semiconductor device according to at least one embodiment of the present disclosure.

As shown in FIG. 2C, the third barrier film 18 is formed on the inner side surfaces of the first through via hole 15, the second through via hole 17a, and the recess 17b, the bottom portion (on the third conductor 22) of the first through via hole 15, and an upper surface of the third insulating film 16. The third barrier film 18 is formed using, for example, an ALD method. The third barrier film 18 may contain silicon and nitrogen, and may be, for example, a silicon nitride film or a silicon carbonitride film.

Figure 2D:
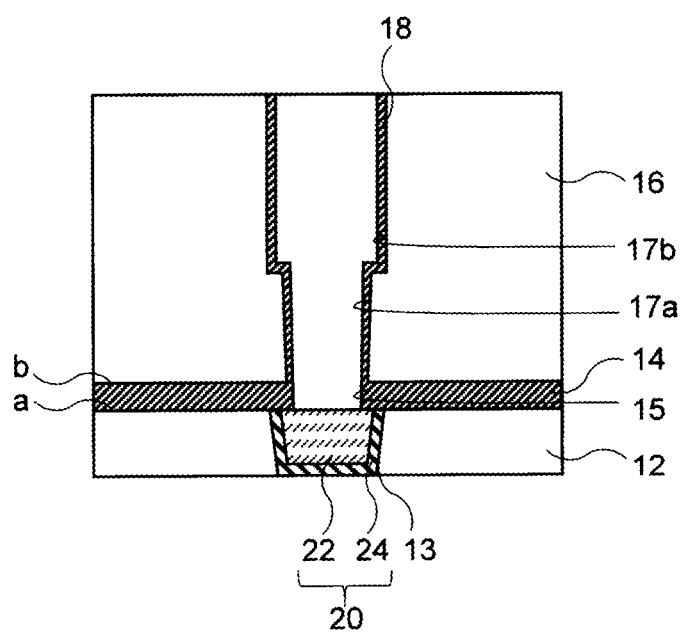
FIG. 2D is a cross-sectional view illustrating the method for manufacturing the semiconductor device according to at least one embodiment of the present disclosure.

As shown in FIG. 2D, the third barrier film 18 at the bottom portion (on the third conductor 22) of the first through via hole 15 and on the upper surface of the third insulating film 16 is removed. The third barrier film 18 on the bottom portion (on the third conductor 22) of the first through via hole 15 and the upper surface of the third insulating film 16 is removed by, for example, performing anisotropic etching by reactive ion etching, and the third barrier film 18 on the inner side surfaces of the first through via hole 15, the second through via hole 17a, and the recess 17b remains.

Figure 2E:
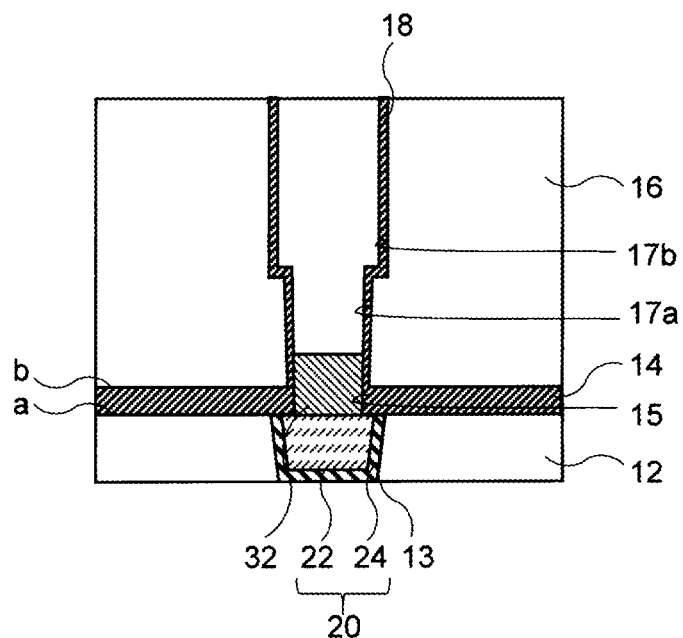
FIG. 2E is a cross-sectional view illustrating the method for manufacturing the semiconductor device according to at least one embodiment of the present disclosure.

As shown in FIG. 2E, the first conductor 32 is formed on the third conductor 22 at the bottom portion of the first through via hole 15. The first conductor 32 is selectively grown using, for example, an ALD method. A film thickness of the first conductor 32 is not particularly limited, and is preferably 10 nm or more, for example, 100 nm. By forming the first conductor 32 on the third conductor 22, the aspect ratio of the first through via hole 15 and the second through via hole 17a can be moderated (reduced). By forming the first conductor 32 on the third conductor 22, the component contained in the third conductor 22 may diffuse into the first conductor 32. However, by covering the first conductor 32 with the third barrier film 18, the component contained in the third conductor 22 can be prevented from diffusing into the third insulating film 16.

Figure 2F:
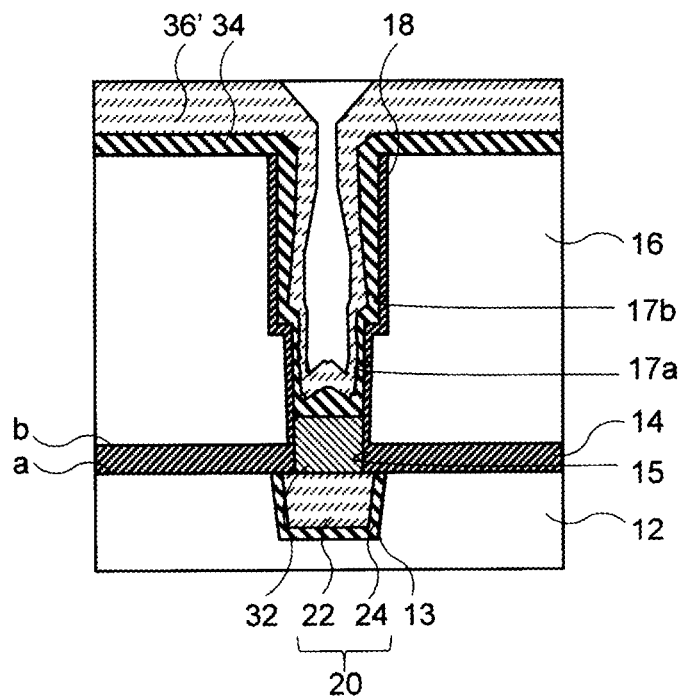
FIG. 2F is a cross-sectional view illustrating the method for manufacturing the semiconductor device according to at least one embodiment of the present disclosure.

As shown in FIG. 2F, the second conductor 36 is formed on the first conductor 32 in the second through via hole 17a and in the recess 17b via the first barrier film 34. Thereafter, annealing is performed, and excess portions of the second conductor 36 and the first barrier film 34 up to the upper surface of the third insulating film 16 are removed by chemical mechanical polishing, whereby the interconnect structure 10a shown in FIG. 2A can be manufactured.

Third Embodiment

Configuration of Interconnect Structure

Figure 3A:
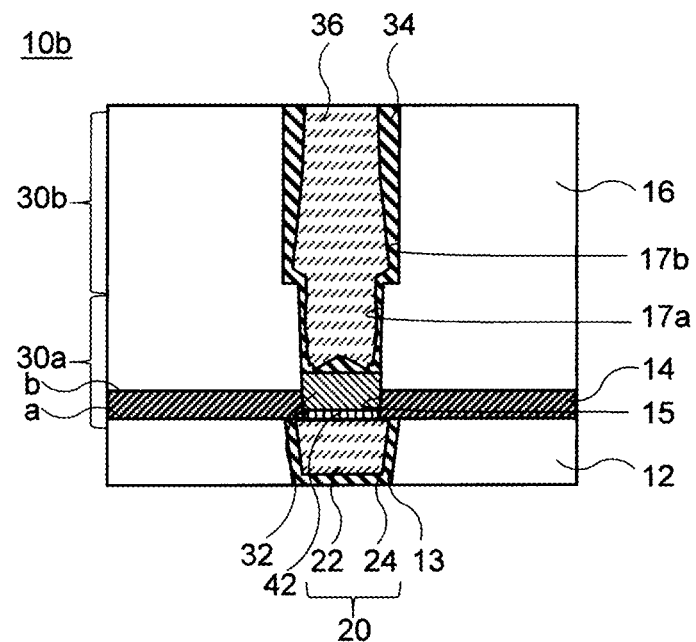
FIG. 3A is a cross-sectional view illustrating a semiconductor device according to at least one embodiment of the present disclosure.

A configuration of an interconnect structure of a semiconductor device according to the present embodiment will be described with reference to FIG. 3A. FIG. 3A is a cross-sectional view illustrating an interconnect structure 10b of the semiconductor device according to the present embodiment. The configuration of the interconnect structure according to the present embodiment is the same as the configuration of the interconnect structure according to the first embodiment except that a fourth barrier film 42 is provided. A description that is the same as the first embodiment will be omitted, and a portion different from the configuration of the interconnect structure according to the first embodiment will be described here.

As shown in FIG. 3A, the interconnect structure 10b includes the first insulating film 12, the second insulating film 14, the third insulating film 16, the lower layer interconnect 20 disposed in the first insulating film 12, the upper layer interconnect 30b disposed in the third insulating film 16, and the plug 30a connecting the lower layer interconnect 20 and the upper layer interconnect 30b.

The first insulating film 12 has the recess 13 having an opening in the surface a. The lower layer interconnect 20 is disposed in the recess 13. The lower layer interconnect 20 includes the third conductor 22 and the second barrier film 24.

The second insulating film 14 includes the first through via hole 15 penetrating from the surface a to the surface b. The first through via hole 15 is connected to the recess 13. A part of the plug 30a is disposed in the first through via hole 15. The plug 30a disposed in the first through via hole 15 includes the fourth barrier film 42 and the first conductor 32. The fourth barrier film 42 and the first conductor 32 are disposed in the first through via hole 15. The fourth barrier film 42 is disposed at a bottom portion of the first through via hole 15. The fourth barrier film 42 is exposed on the surface a. The fourth barrier film 42 is in contact with the third conductor 22 on the surface a. The first conductor 32 is disposed on and in contact with the fourth barrier film 42 in the first through via hole 15. The first conductor 32 is formed thicker than the second insulating film 14. An upper surface of the first conductor 32 is located above the surface b. However, the present disclosure is not limited thereto, and the upper surface of the first conductor 32 may be located between the surface a and the surface b. The third conductor 22 exposed at the bottom portion of the first through via hole 15 is covered with the fourth barrier film 42. That is, the first conductor 32 and the third conductor 22 are not in contact with each other.

The third insulating film 16 has the second through via hole 17a and the recess 17b. The second through via hole 17a is connected to the first through via hole 15. The recess 17b is connected to the second through via hole 17a. A part of the plug 30a is disposed in the second through via hole 17a. The plug 30a disposed in the second through via hole 17a includes the first conductor 32, the first barrier film 34, and the second conductor 36. The upper layer interconnect 30b is disposed in the recess 17b. The upper layer interconnect 30b includes the first barrier film 34 and the second conductor 36. The first conductor 32, the first barrier film 34, and the second conductor 36 are disposed in the second through via hole 17a and the recess 17b. The first conductor 32 is in contact with the third insulating film 16 in the second through via hole 17a. The first conductor 32 disposed in the first through via hole 15 and the second through via hole 17a is continuous. The first barrier film 34 and the second conductor 36 are disposed on the first conductor 32 in the second through via hole 17a and in the recess 17b. The first barrier film 34 is in contact with the first conductor 32 and the third insulating film 16 in the second through via hole 17a and the recess 17b. The second conductor 36 is in contact with the first barrier film 34 in the second through via hole 17a and the recess 17b. The second conductor 36 other than an upper surface thereof is covered with the first barrier film 34. That is, the first barrier film 34 is disposed on inner side surfaces of the second through via hole 17a and the recess 17b and a surface in contact with the first conductor 32, and the second conductor 36 is not in contact with the third insulating film 16.

A total aspect ratio of the continuous first through via hole 15 and second through via hole 17a may be two or more. A thickness (height from the surface a) of the first conductor 32 is not particularly limited, and may be 10 nm or more, or may be 100 nm. The first conductor 32 may contain tungsten, molybdenum, or ruthenium. The fourth barrier film 42 may contain titanium and oxygen, and may be, for example, titanium oxide. The second barrier film 24 may be titanium or titanium nitride.

In the interconnect structure 10b according to the present embodiment, even if the total aspect ratio of the first through via hole 15 and the second through via hole 17a is a high aspect ratio of, for example, 2 or more, the first conductor 32 is disposed on the lower layer interconnect 20, which moderates (reduces) the aspect ratio. With such a configuration, it is possible to prevent generation of voids in the second conductor 36 due to insufficient coverage of the first barrier film 34, blocking of a frontage of the second conductor 36, or the like. The interconnect structure 10b according to the present embodiment includes the fourth barrier film 42, and thus the third conductor 22 is surrounded by the second insulating film 14, the second barrier film 24, and the fourth barrier film 42. With such a configuration, a component (for example, copper) contained in the third conductor 22 can be prevented from diffusing into the first insulating film 12 or the third insulating film 16. Accordingly, interconnect reliability of the semiconductor device according to the present embodiment can be improved.

Method for Manufacturing Interconnect Structure

FIGS. 3B to 3E are cross-sectional views illustrating a method for manufacturing the interconnect structure of the semiconductor device according to the present embodiment. The method for manufacturing the interconnect structure according to the present embodiment is the same as the method for manufacturing the interconnect structure according to the first embodiment except that the fourth barrier film 42 is formed. A description that is the same as the first embodiment will be omitted, and a portion different from the configuration of the interconnect structure according to the first embodiment will be described here.

Figure 3B:
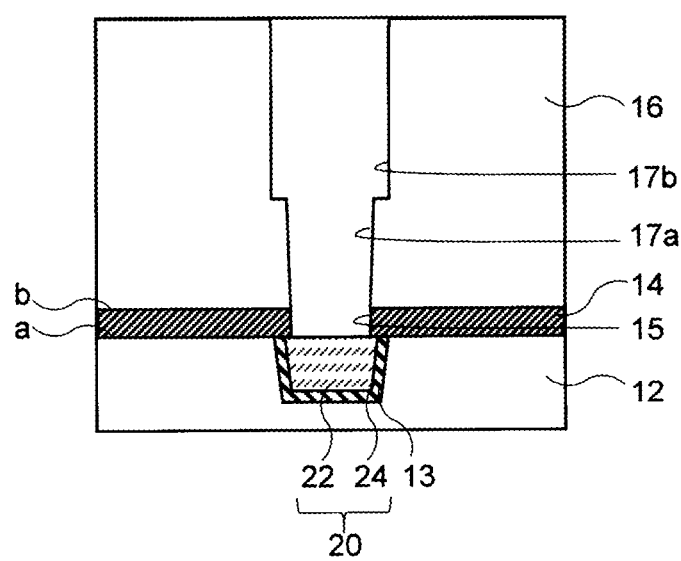
FIG. 3B is a cross-sectional view illustrating a method for manufacturing the semiconductor device according to at least one embodiment of the present disclosure.

As shown in FIG. 3B, the lower layer interconnect 20 is formed in the first insulating film 12. First, the recess 13 is formed in an upper surface of the first insulating film 12. Next, the third conductor 22 is formed in the recess 13 via the second barrier film 24 to form the lower layer interconnect 20. By covering the third conductor 22 with the second barrier film 24, the component contained in the third conductor 22 can be prevented from diffusing into the first insulating film 12.

The second insulating film 14 and the third insulating film 16 are sequentially formed on the first insulating film 12 including the lower layer interconnect 20. A film thickness of the second insulating film 14 is not particularly limited. As shown in FIG. 3B, in the second insulating film 14 and the third insulating film 16, the recess 17b in which the upper layer interconnect 30b is disposed and the first through via hole 15 and the second through via hole 17a that reach the lower layer interconnect 20 from the recess 17b are formed. The total aspect ratio of the first through via hole 15 and the second through via hole 17a may be two or more. By forming the first through via hole 15 and the second through via hole 17a on the recess 17b, an upper surface of the third conductor 22 of the lower layer interconnect 20 is exposed at the bottom portion of the first through via hole 15. By partially covering the third conductor 22 with the second insulating film 14, the component contained in the third conductor 22 can be prevented from diffusing into the third insulating film 16.

Figure 3C:
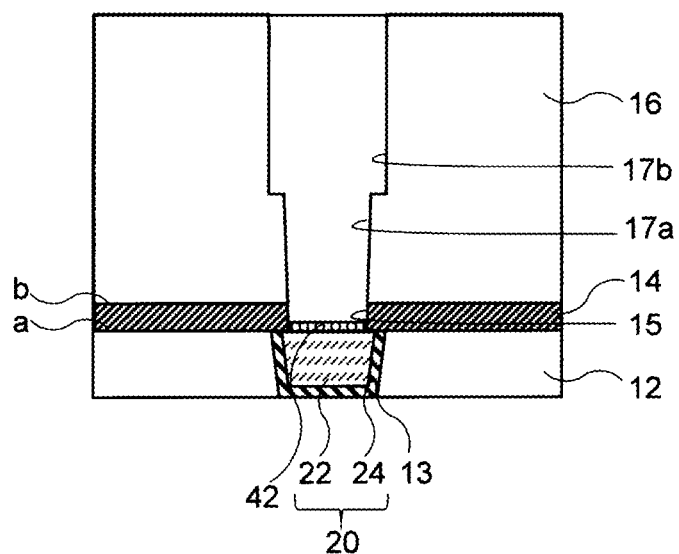
FIG. 3C is a cross-sectional view illustrating the method for manufacturing the semiconductor device according to at least one embodiment of the present disclosure.

As shown in FIG. 3C, the fourth barrier film 42 is formed on the bottom portion (on the third conductor 22) of the first through via hole 15. The fourth barrier film 42 may be formed, for example, by diffusing the second barrier film 24 by performing an annealing treatment under an argon or nitrogen atmosphere and oxidizing the second barrier film 24 by performing an annealing treatment under an oxygen atmosphere. The fourth barrier film 42 may contain titanium and oxygen, and may be, for example, titanium oxide. The fourth barrier film 42 may include a titanium layer on a surface in contact with the third conductor 22. By covering the third conductor 22 with the fourth barrier film 42, the component contained in the third conductor 22 can be prevented from diffusing into the third insulating film 16.

Figure 3D:
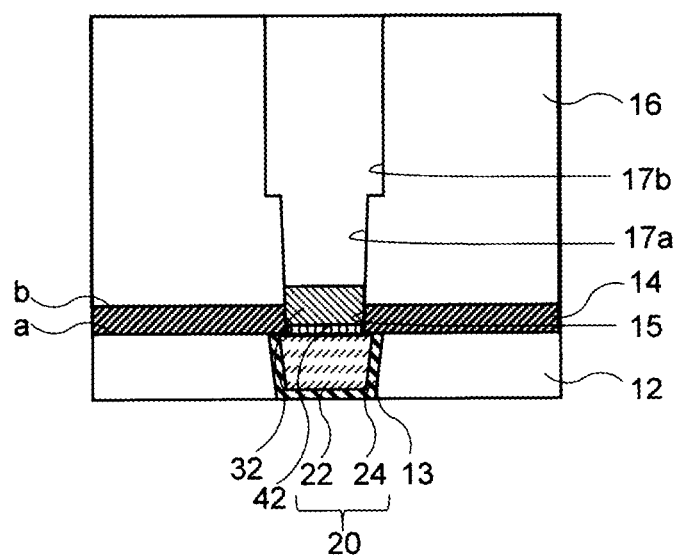
FIG. 3D is a cross-sectional view illustrating the method for manufacturing the semiconductor device according to at least one embodiment of the present disclosure.

As shown in FIG. 3D, the first conductor 32 is formed on the fourth barrier film 42 at the bottom portion of the first through via hole 15. The first conductor 32 is selectively grown using, for example, an ALD method. A film thickness of the first conductor 32 is not particularly limited, and is preferably 10 nm or more, for example, 100 nm. By forming the first conductor 32 on the fourth barrier film 42, the aspect ratio of the first through via hole 15 and the second through via hole 17a can be moderated (reduced). By forming the first conductor 32 on the fourth barrier film 42, the component contained in the third conductor 22 can be prevented from diffusing into the first conductor 32.

Figure 3E:
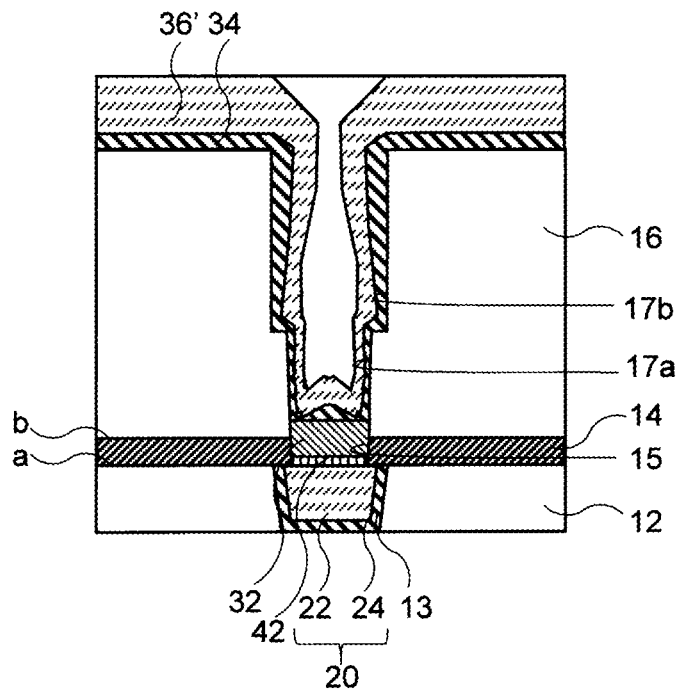
FIG. 3E is a cross-sectional view illustrating the method for manufacturing the semiconductor device according to at least one embodiment of the present disclosure.

As shown in FIG. 3E, the second conductor 36 is formed on the first conductor 32 in the second through via hole 17a and in the recess 17b via the first barrier film 34. Thereafter, annealing is performed, and excess portions of the second conductor 36 and the first barrier film 34 up to the upper surface of the third insulating film 16 are removed by chemical mechanical polishing, whereby the interconnect structure 10b shown in FIG. 3A can be manufactured.

Fourth Embodiment

Configuration of Interconnect Structure

Figure 4A:
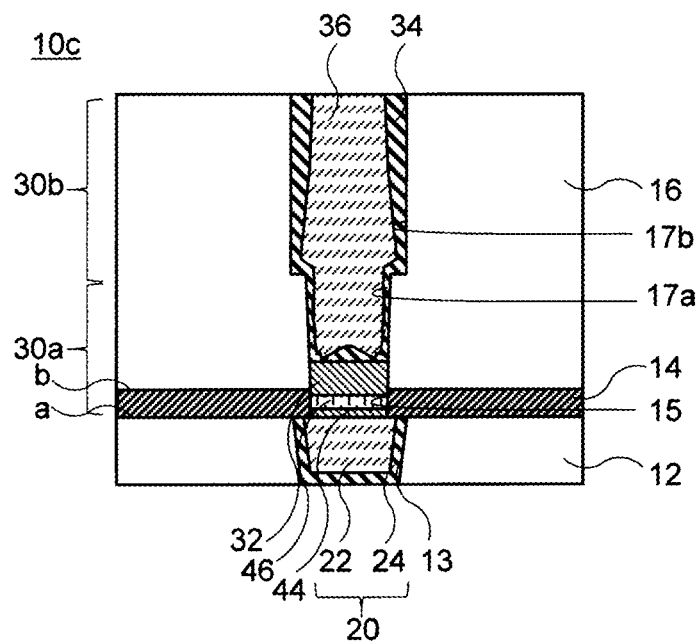
FIG. 4A is a cross-sectional view illustrating a semiconductor device according to at least one embodiment of the present disclosure.

A configuration of an interconnect structure of a semiconductor device according to the present embodiment will be described with reference to FIG. 4A. FIG. 4A is a cross-sectional view illustrating an interconnect structure 10c of the semiconductor device according to the present embodiment. The configuration of the interconnect structure according to the present embodiment is the same as the configuration of the interconnect structure according to the first embodiment except that a conductive film 44 and a fifth barrier film 46 are provided. A description that is the same as the first embodiment will be omitted, and a portion different from the configuration of the interconnect structure according to the first embodiment will be described here.

As shown in FIG. 4A, the interconnect structure 10c includes the first insulating film 12, the second insulating film 14, the third insulating film 16, the lower layer interconnect 20 disposed in the first insulating film 12, the upper layer interconnect 30b disposed in the third insulating film 16, and the plug 30a connecting the lower layer interconnect 20 and the upper layer interconnect 30b.

The first insulating film 12 has the recess 13 having an opening in the surface a. The lower layer interconnect 20 is disposed in the recess 13. The lower layer interconnect 20 includes the third conductor 22 and the second barrier film 24.

The second insulating film 14 has the first through via hole 15 penetrating from the surface a to the surface b. The first through via hole 15 is connected to the recess 13. A part of the plug 30a is disposed in the first through via hole 15. The plug 30a disposed in the first through via hole 15 includes the conductive film 44, the fifth barrier film 46, and the first conductor 32. The conductive film 44, the fifth barrier film 46, and the first conductor 32 are disposed in the first through via hole 15. The conductive film 44 is disposed at a bottom portion of the first through via hole 15. The conductive film 44 is exposed on the surface a. The conductive film 44 is in contact with the third conductor 22 at the surface a. The fifth barrier film 46 is disposed on and in contact with the conductive film 44 in the first through via hole 15. The first conductor 32 is disposed on and in contact with the fifth barrier film 46 in the first through via hole 15. The conductive film 44 and the fifth barrier film 46 are formed thinner than the second insulating film 14. An upper surface of the fifth barrier film 46 is located below the surface b. However, the present disclosure is not limited thereto, and the upper surface of the fifth barrier film 46 may be located above the surface b. In this case, a lower surface of the fifth barrier film 46 may be located below the surface b. That is, a film thickness of the conductive film 44 may be smaller than a film thickness of the second insulating film 14. The first conductor 32 is formed thicker than the second insulating film 14. An upper surface of the first conductor 32 is located above the surface b. However, the present disclosure is not limited thereto, and the upper surface of the first conductor 32 may be located between the surface a and the surface b. The third conductor 22 exposed at the bottom portion of the first through via hole 15 is covered with the fifth barrier film 46 via the conductive film 44. That is, the first conductor 32 and the third conductor 22 are not in contact with each other.

The third insulating film 16 has the second through via hole 17a and the recess 17b. The second through via hole 17a is connected to the first through via hole 15. The recess 17b is connected to the second through via hole 17a. A part of the plug 30a is disposed in the second through via hole 17a. The plug 30a disposed in the second through via hole 17a includes the first conductor 32, the first barrier film 34, and the second conductor 36. The upper layer interconnect 30b is disposed in the recess 17b. The upper layer interconnect 30b includes the first barrier film 34 and the second conductor 36. The first conductor 32, the first barrier film 34, and the second conductor 36 are disposed in the second through via hole 17a and the recess 17b. The first conductor 32 is in contact with the third insulating film 16 in the second through via hole 17a. The first conductor 32 disposed in the first through via hole 15 and the second through via hole 17a is continuous. The first barrier film 34 and the second conductor 36 are disposed on the first conductor 32 in the second through via hole 17a and in the recess 17b. The first barrier film 34 is in contact with the first conductor 32 and the third insulating film 16 in the second through via hole 17a and the recess 17b. The second conductor 36 is in contact with the first barrier film 34 in the second through via hole 17a and the recess 17b. The second conductor 36 other than an upper surface thereof is covered with the first barrier film 34. That is, the first barrier film 34 is disposed on inner side surfaces of the second through via hole 17a and the recess 17b and a surface in contact with the first conductor 32, and the second conductor 36 is not in contact with the third insulating film 16.

A total aspect ratio of the continuous first through via hole 15 and second through via hole 17a may be two or more. A thickness (height from the surface a) of the first conductor 32 is not particularly limited, and may be 10 nm or more, or may be 100 nm. The first conductor 32 may contain tungsten, molybdenum, or ruthenium. The conductive film 44 may contain tungsten, and the fifth barrier film 46 may contain tungsten and nitrogen, and may be, for example, tungsten nitride.

In the interconnect structure 10c according to the present embodiment, even if the total aspect ratio of the first through via hole 15 and the second through via hole 17a is a high aspect ratio of, for example, 2 or more, the first conductor 32 is disposed on the lower layer interconnect 20, which moderates (reduces) the aspect ratio. With such a configuration, it is possible to prevent generation of voids in the second conductor 36 due to insufficient coverage of the first barrier film 34, blocking of a frontage of the second conductor 36, or the like. The interconnect structure 10c according to the present embodiment includes the fifth barrier film 46, and thus the third conductor 22 is surrounded by the second insulating film 14, the second barrier film 24, and the fifth barrier film 46. With such a configuration, a component (for example, copper) contained in the third conductor 22 can be prevented from diffusing into the first insulating film 12 or the third insulating film 16. Accordingly, interconnect reliability of the semiconductor device according to the present embodiment can be improved.

Method for Manufacturing Interconnect Structure

FIGS. 4B to 4F are cross-sectional views illustrating a method for manufacturing the interconnect structure of the semiconductor device according to the present embodiment. The method for manufacturing the interconnect structure according to the present embodiment is the same as the method for manufacturing the interconnect structure according to the first embodiment except that the conductive film 44 and the fifth barrier film 46 are formed. A description that is the same as the first embodiment will be omitted, and a portion different from the configuration of the interconnect structure according to the first embodiment will be described here.

Figure 4B:
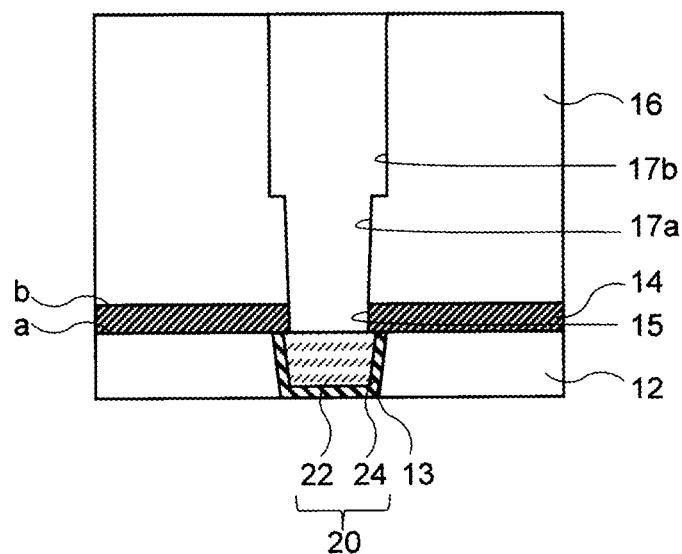
FIG. 4B is a cross-sectional view illustrating a method for manufacturing the semiconductor device according to at least one embodiment of the present disclosure.

As shown in FIG. 4B, the lower layer interconnect 20 is formed in the first insulating film 12. First, the recess 13 is formed in an upper surface of the first insulating film 12. Next, the third conductor 22 is formed in the recess 13 via the second barrier film 24 to form the lower layer interconnect 20. By covering the third conductor 22 with the second barrier film 24, the component contained in the third conductor 22 can be prevented from diffusing into the first insulating film 12.

The second insulating film 14 and the third insulating film 16 are sequentially formed on the first insulating film 12 including the lower layer interconnect 20. A film thickness of the second insulating film 14 is not particularly limited. As shown in FIG. 4B, in the second insulating film 14 and the third insulating film 16, the recess 17b in which the upper layer interconnect 30b is disposed and the first through via hole 15 and the second through via hole 17a that reach the lower layer interconnect 20 from the recess 17b are formed. The total aspect ratio of the first through via hole 15 and the second through via hole 17a may be two or more. By forming the first through via hole 15 and the second through via hole 17a on the recess 17b, an upper surface of the third conductor 22 of the lower layer interconnect 20 is exposed at the bottom portion of the first through via hole 15. By partially covering the third conductor 22 with the second insulating film 14, the component contained in the third conductor 22 can be prevented from diffusing into the third insulating film 16.

Figure 4C:
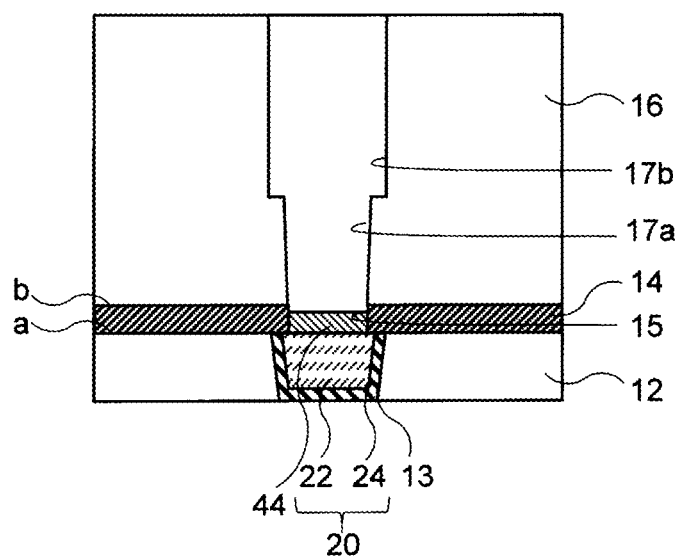
FIG. 4C is a cross-sectional view illustrating the method for manufacturing the semiconductor device according to at least one embodiment of the present disclosure.

As shown in FIG. 4C, the conductive film 44 is formed at the bottom portion (on the third conductor 22) of the first through via hole 15. The conductive film 44 is selectively grown using, for example, an ALD method. The film thickness of the conductive film 44 is not particularly limited, and is preferably smaller than the film thickness of the second insulating film 14.

Figure 4D:
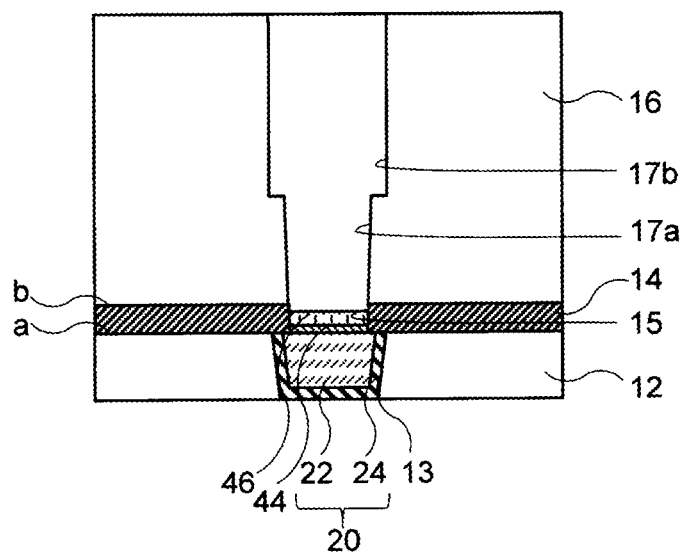
FIG. 4D is a cross-sectional view illustrating the method for manufacturing the semiconductor device according to at least one embodiment of the present disclosure.

As shown in FIG. 4D, the fifth barrier film 46 is formed on the conductive film 44. The fifth barrier film 46 may be formed by, for example, nitriding an upper surface side of the conductive film 44 by performing a plasma treatment under an ammonia atmosphere. The fifth barrier film 46 may contain tungsten and nitrogen, and may be, for example, tungsten nitride. By covering the third conductor 22 with the fifth barrier film 46, the component contained in the third conductor 22 can be prevented from diffusing into the third insulating film 16.

Figure 4E:
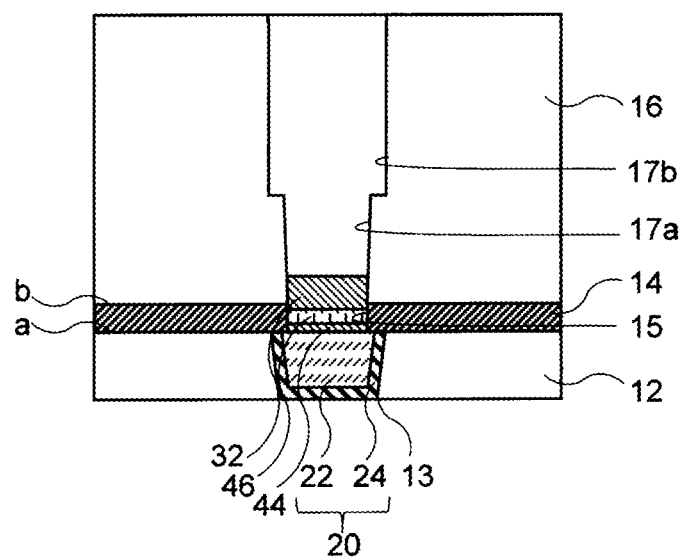
FIG. 4E is a cross-sectional view illustrating the method for manufacturing the semiconductor device according to at least one embodiment of the present disclosure.

As shown in FIG. 4E, the first conductor 32 is formed on the fifth barrier film 46 at the bottom portion of the first through via hole 15. The first conductor 32 is selectively grown using, for example, an ALD method. A film thickness of the first conductor 32 is not particularly limited, and is preferably 10 nm or more, for example, 100 nm. By forming the first conductor 32 on the fifth barrier film 46, the aspect ratio of the first through via hole 15 and the second through via hole 17*a* can be moderated (reduced). By forming the first conductor 32 on the fifth barrier film 46, the component contained in the third conductor 22 can be prevented from diffusing into the first conductor 32.

Figure 4F:
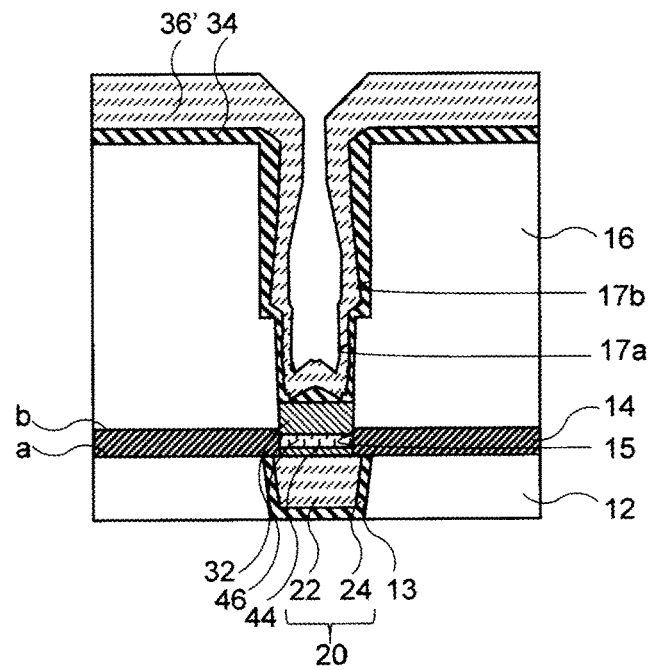
FIG. 4F is a cross-sectional view illustrating the method for manufacturing the semiconductor device according to at least one embodiment of the present disclosure.

As shown in FIG. 4F, the second conductor 36 is formed on the first conductor 32 in the second through via hole 17*a* and in the recess 17*b* via the first barrier film 34. Thereafter, annealing is performed, and excess portions of the second conductor 36 and the first barrier film 34 up to an upper surface of the third insulating film 16 are removed by chemical mechanical polishing, whereby the interconnect structure 10*c* shown in FIG. 4A can be manufactured.

Fifth Embodiment

Configuration of Semiconductor Device

Figure 5:
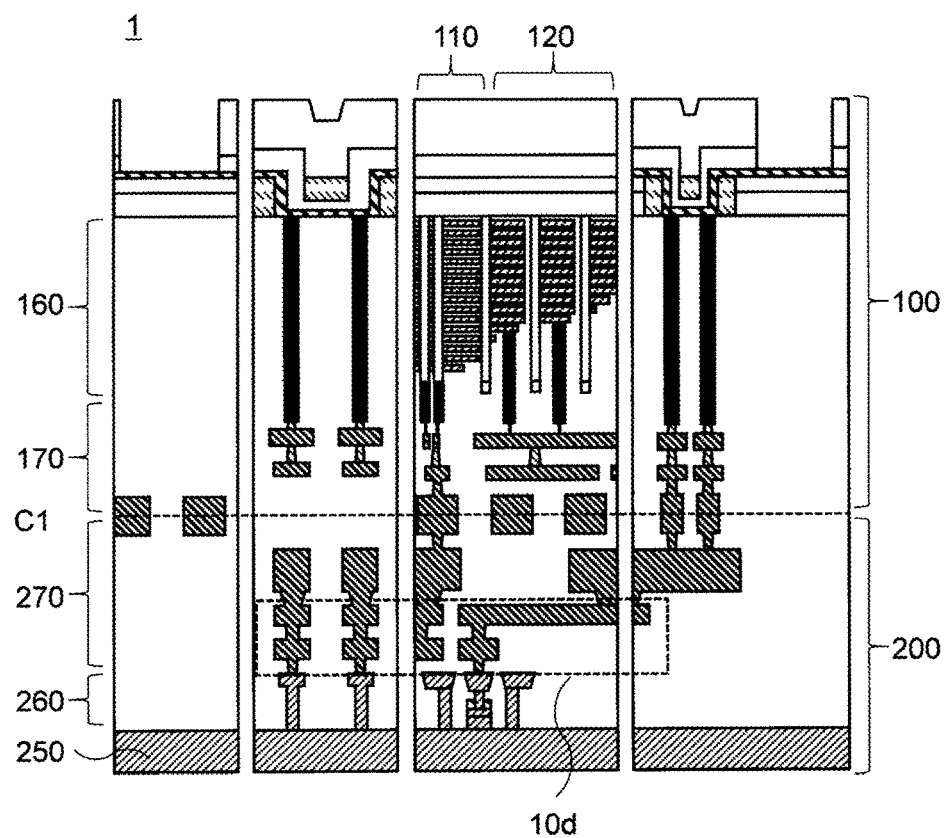
FIG. 5 is a cross-sectional view illustrating a semiconductor device according to at least one embodiment of the present disclosure.

A configuration of a semiconductor device 1 according to the present embodiment will be described with reference to FIG. 5. FIG. 5 is a cross-sectional view showing a basic configuration of the semiconductor device 1. As shown in FIG. 5, the semiconductor device 1 is a stacked substrate, and includes a memory cell array chip 100 and a control circuit (CMOS circuit) chip 200. The memory cell array chip 100 and the control circuit chip 200 are connected to each other at a connection surface C1.

Structure of Memory Cell Array Chip

As shown in FIG. 5, the memory cell array chip 100 includes a plurality of electrode layers 160, a plurality of semiconductor pillars 150, and a memory side interconnect layer 170. The plurality of electrode layers 160 are alternately stacked with a plurality of insulating layers (not shown). Each of the semiconductor pillars 150 penetrates the plurality of stacked electrode layers 160 in a direction perpendicular to the substrate. The semiconductor pillar 150 functions as a plurality of transistors including memory cells by being combined with the plurality of electrode layers 160 via the insulating layers. That is, in a memory cell array region 110, the plurality of transistors including the memory cells are three-dimensionally arranged. The semiconductor pillar 150 is electrically connected to a source line at one end (substrate side), and is electrically connected to the memory side interconnect layer 170 at the other end (side opposite to the substrate). Connection terminals that are connected to the control circuit chip 200 are disposed on the connection surface C1 of the memory side interconnect layer 170.

On the substrate, a lead region 120 is arranged side by side with the memory cell array region 110. In the lead region 120, terminal portions of the plurality of electrode layers 160 are led stepwise. Further, each terminal portion is connected to a vertical interconnect via a contact hole opened in the insulating film. These vertical interconnects are electrically connected to the memory side interconnect layer 170, and are connected to the control circuit chip 200 via the connection terminals.

Structure of Control Circuit Chip

As shown in FIG. 5, the control circuit chip 200 includes a substrate 250, a plurality of transistors 260 constituting a control circuit, and a circuit side interconnect layer 270. The plurality of transistors 260 are formed on the substrate 250, and are electrically connected to the circuit side interconnect layer 270 on a side opposite to the substrate 250. Connection terminals that are connected to the memory cell array chip 100 are disposed on the connection surface C1 of the circuit side interconnect layer 270. The substrate 250 may be a semiconductor wafer such as a silicon substrate.

The circuit side interconnect layer 270 includes an interconnect structure 10*d*. Here, the interconnect structure 10*d* corresponds to an interconnect or a via plug of the circuit side interconnect layer 270.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first insulating film;
   an interconnect disposed in the first insulating film, the interconnect contains copper, cobalt, nickel, or manganese;
   a second insulating film including a first portion connected to the interconnect, the second insulating film contains silicon and nitrogen;
   a third insulating film including a second portion connected to the first portion;
   a first film disposed in the first portion, covering the interconnect, and containing (i) titanium and oxygen, or (ii) tungsten and nitrogen;
   a first conductor disposed in the first portion and in contact with the first film;
   a second film on a side surface of the second portion; and
   a second conductor disposed in the second portion and in contact with the second film.

2. The semiconductor device according to claim 1, wherein
   the first conductor is disposed in the second portion, the first conductor being in contact with the second film.

3. The semiconductor device according to claim 1, wherein
- the first and third insulating films contain silicon and oxygen,
- the second film contains titanium,
- the first conductor contains tungsten, molybdenum, or ruthenium, and
- the second conductor contains copper.

4. The semiconductor device according to claim 1, wherein the second conductor is disposed in the first portion.

5. The semiconductor device according to claim 1, wherein the first film and the second film are each a barrier film.

\* \* \* \* \*